(12) United States Patent
Peterson et al.

(10) Patent No.: US 8,294,600 B2
(45) Date of Patent: Oct. 23, 2012

(54) KEYBOARD ADAPTIVE HAPTIC RESPONSE

(76) Inventors: Cody George Peterson, Coeur d'Alene, ID (US); Andrew Parris Huska, Post Falls, ID (US); James William Schlosser, Spokane, WA (US)

( * ) Notice: Subject to any disclaimer, the term of this patent is extended or adjusted under 35 U.S.C. 154(b) by 150 days.

(21) Appl. No.: 12/371,301

(22) Filed: Feb. 13, 2009

(65) Prior Publication Data
US 2009/0210568 A1  Aug. 20, 2009

Related U.S. Application Data

(60) Provisional application No. 61/029,195, filed on Feb. 15, 2008.

(51) Int. Cl.
*H03K 17/94* (2006.01)
*H03M 11/00* (2006.01)

(52) U.S. Cl. ............... 341/27; 84/615; 84/653; 345/156

(58) Field of Classification Search .................. 84/615, 84/653; 341/22–34; 345/156, 157
See application file for complete search history.

(56) References Cited

U.S. PATENT DOCUMENTS

| | | | |
|---|---|---|---|
| 4,200,778 A | 4/1980 | Bovio et al. | |
| 4,529,849 A | 7/1985 | Kamei et al. | |
| 5,057,657 A | 10/1991 | Skulic | |
| 5,612,692 A | 3/1997 | Dugas et al. | |
| 5,676,476 A | 10/1997 | Uke | |
| 5,729,222 A | 3/1998 | Iggulden et al. | |
| 5,943,233 A * | 8/1999 | Ebina et al. | 700/85 |
| 6,003,390 A | 12/1999 | Cousy | |
| 6,218,966 B1 * | 4/2001 | Goodwin et al. | 341/27 |
| 6,684,166 B2 | 1/2004 | Bellwood et al. | |
| 6,791,480 B1 | 9/2004 | Uke | |
| 7,166,795 B2 | 1/2007 | Lengeling | |
| 7,182,691 B1 | 2/2007 | Schena | |
| 7,196,688 B2 | 3/2007 | Schena | |
| 7,339,572 B2 | 3/2008 | Schena | |
| 7,342,573 B2 | 3/2008 | Ryynanen | |
| 7,741,979 B2 * | 6/2010 | Schlosser et al. | 341/27 |
| 7,791,588 B2 * | 9/2010 | Tierling et al. | 345/156 |
| 7,834,857 B2 | 11/2010 | Prados | |
| 8,248,277 B2 | 8/2012 | Peterson et al. | |
| 8,248,278 B2 | 8/2012 | Schlosser et al. | |
| 2002/0054060 A1 | 5/2002 | Schena | |

(Continued)

FOREIGN PATENT DOCUMENTS

DE    2005002417    4/2005

(Continued)

OTHER PUBLICATIONS

"PCT Search Report", Application Serial No. PCT/US2009/032292, (Aug. 11, 2009),17 pages.

(Continued)

*Primary Examiner* — David S. Warren

(57) ABSTRACT

Various embodiments provide a keyboard that adaptively provides haptic feedback to a user. In at least some embodiments, an actuation of a key or keyboard element of the keyboard is detected. This can be accomplished by detecting the closure of an associated switch caused by a user depressing the key or keyboard element. In response to detecting the actuation, an electrically-deformable material is utilized as an actuating mechanism to impart single or multi-vectored movement to the key or keyboard element according to drive parameters. This movement produces a perceived acceleration of the key or keyboard element, thus providing haptic feedback which simulates a "snapover" effect.

25 Claims, 6 Drawing Sheets

U.S. PATENT DOCUMENTS

| | | | |
|---|---|---|---|
| 2002/0149561 A1 | 10/2002 | Fukumoto et al. | |
| 2003/0208324 A1 | 11/2003 | Bellwood et al. | |
| 2003/0209131 A1 | 11/2003 | Asahi | |
| 2004/0031673 A1 | 2/2004 | Levy | |
| 2004/0085716 A1 | 5/2004 | Uke | |
| 2004/0130526 A1 | 7/2004 | Rosenberg | |
| 2004/0252104 A1 | 12/2004 | Nakamura et al. | |
| 2005/0017947 A1 | 1/2005 | Shahoian et al. | |
| 2005/0134561 A1* | 6/2005 | Tierling et al. | 345/156 |
| 2005/0157893 A1 | 7/2005 | Pelrine et al. | |
| 2005/0204906 A1 | 9/2005 | Lengeling | |
| 2006/0187201 A1* | 8/2006 | Rosenberg et al. | 345/156 |
| 2006/0256075 A1 | 11/2006 | Anastas et al. | |
| 2006/0267949 A1 | 11/2006 | Rosenberg | |
| 2006/0279538 A1* | 12/2006 | Chang et al. | 345/156 |
| 2006/0290662 A1* | 12/2006 | Houston et al. | 345/156 |
| 2007/0146317 A1 | 6/2007 | Schena | |
| 2007/0152974 A1 | 7/2007 | Kim | |
| 2007/0193436 A1 | 8/2007 | Chu | |
| 2007/0203011 A1 | 8/2007 | Gudgel et al. | |
| 2007/0234887 A1 | 10/2007 | Sawada et al. | |
| 2007/0234890 A1 | 10/2007 | Yamashita | |
| 2007/0236449 A1 | 10/2007 | Lacroix | |
| 2007/0236450 A1 | 10/2007 | Colgate et al. | |
| 2007/0251810 A1 | 11/2007 | Corcoran et al. | |
| 2007/0285284 A1 | 12/2007 | Matteo et al. | |
| 2008/0010593 A1 | 1/2008 | Uusitalo et al. | |
| 2008/0042978 A1 | 2/2008 | Perez-Noguera | |
| 2008/0060856 A1 | 3/2008 | Shahoian et al. | |
| 2008/0062144 A1 | 3/2008 | Shahoian et al. | |
| 2008/0062145 A1 | 3/2008 | Shahoian et al. | |
| 2008/0083314 A1 | 4/2008 | Hayashi et al. | |
| 2008/0084384 A1 | 4/2008 | Gregorio et al. | |
| 2008/0092720 A1* | 4/2008 | Yamashita et al. | 84/600 |
| 2008/0197901 A1* | 8/2008 | Cruz-Hernandez et al. | 327/175 |
| 2008/0198139 A1* | 8/2008 | Lacroix et al. | 345/173 |
| 2008/0223706 A1 | 9/2008 | Hagiwara et al. | |
| 2008/0251364 A1 | 10/2008 | Takala et al. | |
| 2008/0289952 A1 | 11/2008 | Pelrine et al. | |
| 2008/0303782 A1 | 12/2008 | Grant et al. | |
| 2009/0002199 A1 | 1/2009 | Lainonen et al. | |
| 2009/0002205 A1 | 1/2009 | Klinghult et al. | |
| 2009/0008234 A1 | 1/2009 | Tolbert et al. | |
| 2009/0072662 A1* | 3/2009 | Sadler et al. | 310/319 |
| 2009/0085878 A1 | 4/2009 | Heubel et al. | |
| 2009/0085882 A1 | 4/2009 | Grant et al. | |
| 2009/0106655 A1 | 4/2009 | Grant et al. | |
| 2009/0135142 A1 | 5/2009 | Fu et al. | |
| 2009/0160763 A1 | 6/2009 | Cauwels et al. | |
| 2009/0167704 A1 | 7/2009 | Terlizzi et al. | |
| 2009/0174672 A1 | 7/2009 | Schmidt | |
| 2009/0178913 A1 | 7/2009 | Peterson et al. | |
| 2009/0188374 A1 | 7/2009 | Folkesson | |
| 2009/0210568 A1* | 8/2009 | Peterson et al. | 710/15 |
| 2009/0231113 A1 | 9/2009 | Olien et al. | |
| 2009/0267921 A1* | 10/2009 | Pryor | 345/177 |
| 2009/0303187 A1 | 12/2009 | Pallakoff | |
| 2010/0045612 A1 | 2/2010 | Moelne | |
| 2010/0108408 A1 | 5/2010 | Colgate et al. | |
| 2010/0130280 A1 | 5/2010 | Arezina et al. | |
| 2010/0160016 A1 | 6/2010 | Shimabukuro et al. | |
| 2010/0171715 A1 | 7/2010 | Peterson | |
| 2010/0177050 A1 | 7/2010 | Heubel et al. | |
| 2011/0073454 A1 | 3/2011 | Chen et al. | |
| 2011/0107958 A1* | 5/2011 | Pance et al. | 116/205 |
| 2011/0148607 A1* | 6/2011 | Zeleny | 340/407.1 |
| 2011/0227763 A1 | 9/2011 | Schlosser et al. | |

FOREIGN PATENT DOCUMENTS

| | | |
|---|---|---|
| DE | 2004005501 | 8/2005 |
| EP | 1310860 | 5/2003 |
| EP | 1548776 | 6/2005 |
| JP | 61000825 A | 1/1986 |
| WO | WO-2009043605 | 4/2009 |

OTHER PUBLICATIONS

"PCT Search Report", Application No. PCT/US2009/032289, (Dec. 23, 2009),13 pages.

"Notice of Allowance", U.S. Appl. No. 11/945,879, (Feb. 23, 2010),6 pages.

"PCT Search Report and Written Opinion", Application No. PCT/US2010/020380, (Apr. 12, 2010),13 pages.

"Supplemental Notice of Allowance", U.S. Appl. No. 11/945,879, (May 20, 2010),5 pages.

Notice of Allowance mailed Apr. 4, 2012, U.S. Appl. No. 12/360,265, 10 pages.

"Final Office Action mailed Nov. 8, 2011", U.S. Appl. No. 12/360,265, 11 pages.

"Non-Final Office Action mailed Oct. 13, 2011", U.S. Appl. No. 12/791,630, 5 pages.

"Non-Final Office Action mailed Dec. 14, 2010", U.S. Appl. No. 12/360,316, 7 pages.

"Non-Final Office Action Mailed Feb. 1, 2012", U.S. Appl. No. 12/360,631, 7 pages.

"Non-Final Office Action mailed May 12, 2011", U.S. Appl. No. 12/360,265, 7 pages.

"Non-Final Office Action mailed Jul. 9, 2009", U.S. Appl. No. 11/945,879, 10 pages.

"Non-Final Office Action mailed Sep. 1, 2011", U.S. Appl. No. 12/403,270, 5 pages.

"Notice of Allowance and Fees Due" mailed Jan. 24, 2012, U.S. Appl. No. 12/791,630, 7 pages.

"Notice of Allowance and Fees Due" mailed Jan. 30, 2012, U.S. Appl. No. 12/360,316, 8 pages.

"Notice of Allowance and Fees Due" mailed Feb. 21, 2012, U.S. Appl. No. 12/403,270, 5 pages.

"Notice of Allowance mailed Oct. 3, 2011", U.S. Appl. No. 12/360,316, 4 pages.

"Tactile Perception and Design", Retrieved from <http:///www.tireesias.org/reports/tpd2.htm>, 10 pages, 2006.

"Haptics: Learning Through Touch", Retrieved from <http://ced.ncsu.edu/nanoscale/haptics.htm>, (2004),5 pages.

Bark, Karlin "Functional Prototype I", Retrieved from <http://bdml.stanford.edu/twiki/bin/view/Haptics/FunctionalPrototype?skin=print.pattern>, (Aug. 9, 2005),3 pages.

"Touch-Hapsys", Retrieved from <http://www.touch-hapsys.org>, 2 pages, 2002.

Pasquero, Jerome "Stimulation of the Fingertip by Lateral Skin Strech", Retrieved from <http://www.cim.mcgill.ca/~jay/index_files/research.htm>, 5 pages, 2005.

Wing, Alan et al., "Multidimensional Haptics Preliminary Report", Retrieved from <http://www.touch-hapsys.org>, (Sep. 21, 2003),pp. 1-125.

Wu, Xingtao et al., "A generalized Capacitance-Based Model for Electrostatic Micro-Actuators", Department of Physics, New Jersey Institute of Technology, Newark, NJ, 07102-1982 Department of Mechanical Engineering, Columbia University, Ny 10027,pp. 1-23.

Jones, Gail et al., "A Comparison of Learning with Haptic and Visual Modalities", National Science Foundation REC-0087389,pp. 1-20.

Kajimoto, Hiroyuki et al., "Electro-Tactile Display with Tactile Primary Color Approach", Graduate School of Information and Technology, The University of Tokyo,2 pages.

Gorinevsky, Dimitry "Adaptive membrane for large lightweight space telescopes", SPIE Astronomical Telescopes and Instrumentation,(2002),pp. 1-9.

Odell, D.L. et al., "MicroRobot Convveyance and Propulsion System Using Comb Drive and Parallel Plate Actuators: The ScuttleBot", UC Berkley,4 pages.

Zou, Jun et al., "Design of a Wide Tuning Range Micromachined Tunable Capacitor for Wireless Communications", Micro Actuators, Sensors, and Systems (MASS) Group Microelectronics Laboratory, University of Illinois, Urbana, IL 61801,6 pages.

Pasquero, Jerome "Stress: A Tactile Display Using Lateral Skin Stretch", Department of Electrical and Computer Engineering McGill University, Montreal,(Oct. 2003),75 pages.

Jones, Lynette "Human Factors and Haptic Interfaces", Department of Mechanical Engineering, Massachusetts Institute of Technology,40 pages.

Yang, Gi-Hun "Novel Haptic Mouse System for Holistic Haptic Display and Potential of Vibrotactile Stimulation", Human-Robot Interaction Reserach Center Korea Advanced Institute of Science and Technology,17 pages.

Hollis, Ralph "Haptics", *Bershire Encyclpedia of Human-Computer Interaction*, Berkshire Publishing Group,(2004),pp. 311-316.

"Proposed Experiment Protocol and Details", Retrieved from <http://bdml.stanford.edu/twiki/bin/view/Haptics/ProposedExperi0mentProtocolAndDetails>, 5 pages, 2006.

Mok Ha, Soon et al., "Interpenetrating Polymern Networks for High-Performance Electroelastomer Artificial Muscles", Department of Materials Science and Engineering, UCLA,pp. 1-19.

Beavers, Alex "Basic Concepts for Commercial Applications of Electroactive Polymer Artificial Muscle", Artificial Muscle Incorporated, Menlo Park, CA,10 pages.

Ashley, Steven "Artificial Muscles", *Scientific American*, Availallbe at <www.sciam.com>,(Oct. 2003),pp. 53-59.

Pasquero, Jerome "Tactile Display Survey", Technical Report TR-CIM 06.04,6 pages.

"Haptic Touch Technology", Pacinian,(Nov. 2007),2 pages.

Bar-Cohen, Yoseph "Electroactive Polymers", Retrieved from <http://electrochem.cwru.edu/ed/encycl/>, Electrochemistry Encyclopedia,(Dec. 2004),7 pages.

Fontaine, Ebraheem "A Laboratory Demonstration of a Parallel Robotic Mechanism", Massachusetts Institue of Technology,(Jun. 2002),pp. 1-14.

"Elastomers: Powerful Polymer", Retrieved from <http://appliancedesign.com/copyright/>, (Jun. 2006),5 pages.

Bar-Cohen, Yoseph "Worldwide Electroactive Polymers", (*Artificial Muscles*) *Newsletter*, vol. 7, No. 2, Available at <http://eap.jpl.nasa.gov>,(Dec. 2005),pp. 1-16.

Bifano, Thomas "Parallel Plate Electrostatic Actuation for High-Resolution Deformable Mirrors", Boston University,(Aug. 19, 2004),35 pages.

Pasquero, Jerome "Survey on Communication Through Touch", *Technical Report: TR-CIM 06.04*, Center for Intelligent Machines Department of Electrical and Computer Engineering,(Jul. 2006),pp. 1-27.

"Touch and Haptics", *2004 IEEE/ RSJ International Conference on Intelligent Robots and Systems*, (Sep. 28, 2004),32 pages.

O'Halloran, A et al., "Materials and Technologies for Artificial Muscle: A Review for the Mechatronic Muscle Project", *Topics in Bio-Mechanical Engineering, Chapter 7*, Department of Electronic Engineering, National University of Ireland Galway,(2004),pp. 184-215.

Biggs, James "Some Useful Information for Tacttile Display Design", *IEEE Transactions on Man-Machine Systems*,vol. 11, No. 1,(1970),pp. 19-24.

Raisamo, Roope "Tactile User Interfaces", New Interaction Techniques,(Aug. 2, 2001),30 pages.

Bar-Cohen, Yoseph "Low Mass Muscle Actuators (LoMMAs)", Telerobotic Task Sponsered by NASA HQ, Code S,(Oct. 23, 1997),18 pages.

"Role of Skin Biomechanics in Mechanoreceptor", Retrieved from <http://touchlab.mit.edu/oldresearch/currentwork/humanhaptics/roleofskinbiomechanics/> on Dec. 20, 2007, MIT Touch Lab,(Dec. 20, 2007),pp. 1-13.

Spires, Shelby "Artificial Strongman", *Smart Business: For The New Economy*, (Nov. 2000),1 page.

Sommer-Larsen, Peter "Artificial Muscles", Rise National Laboratory, Condensed Matter Physics and Chemistry Department,3 pages.

Bar-Cohen, Yoseph "Electric Flex", *IEEE Spectrum Online*, (Jun. 2004),6 pages.

Bar-Cohen, Yoseph "Electroactive Polymers as Artificial Muscles-Capabilities, Potentials and Challenges", *Robotics 2000*, Available at <www.spaceandrobotics>,(Feb. 28-Mar. 2, 2000),pp. 1-8.

Carpi, Federico et al., "Dielectric Elastomers as Electromechanical Transducers: Fundamentals, Materials, Devices, Models and Applications of an Emerging Elecrotactive Polymer Technology", *Elsevier Ltd.*, (2008),12 pages.

"Non final OA", U.S. Appl. No. 11/945,879, (Feb. 13, 2009).

Hayward, Vincent et al., "Tactile Display Device Using Distributed Lateral Skin Stretch", *Proceedings of the Haptic Interfaces for Virtual Environment and Teleoperator Systems Symposium*, ASME International Mechanical Engineering Congress & Exposition,(2000),pp. 1309-1314.

Seeger, Joseph et al., "Dynamics and Control of Parallel-Plate Actuators Beyond the Electrostatic Instability", *Transducers "99 The 10th Interrnational Conference on Solid State Sensors and Actuators*, (Jun. 1999),pp. 474-477.

"Nanoactuators Based on Electrostatic Forces on Dieletrics", Retrieved from <http://www.nasatech.com/Briefs/Apr05/NPO30747.html> on Nov. 28, 2005, NASA's Jet Propulsion Laboratory, Pasadena, CA,4 pages.

Bar-Cohen, Yoseph et al., "Enabling Novel Planetary and Terrestrial Mechanisms Using Electroactive Materials at the JPL's NDEAA Lab", Retrieved from http://ndeaa.jpl.nasa.gov>, pp. 1-6.

Pei, Qibing et al., "Multiple-Degrees-of-Freedom Electroelastomer Roll Actuators", *SRI International Institute of Physics Publishing*, (2004),pp. N86-N92.

"New SRI International sSpin-Off, Artificial Muscle, Inc., Secure Series a Funding from Leading VC Firms", Retrieved from <http://www.sri.com/news/releases/05-03-04.html> on Jan. 30, 2008, SRI International Spin Offs Artificial Muscle, Inc,(May 2004),2 pages.

Jager, Edwin et al., "Microfabricating Conjugated Polymer Actuators", *Science Magazine*, vol. 290, www.sciencemag.org,(Nov. 24, 2000),pp. 1540-1544.

Wingert, Andreas et al., "On the Kinematics of Parallel Mechanisms with Bio-stable Polymer Actuators", Department of Mechanical Engineering, Massachussetts Institute of Technology Cambridge,8 pages.

"Non Final Office Action", U.S. Appl. No. 11/945,879, (Feb. 13, 2009),8 pages.

Bicchi, Antonio et al., "Haptic Illusions Induced by the Tactile Flow", Interdepartmental Research Centre "E. Piaggo", University of Pisa,16 pages.

Wagner, Christopher et al., "Integrating Tactile and Force Feedback with Finite Element Models", Division of Engineering and Applied Sciences, Harvard University,6 pages.

Bar-Cohen, Y. "Electroactive Polymer (EAP) Actuators as Artificial Muscles—Reality, Potential and Challenges", *SPIE Press*, (Mar. 18, 2004),pp. 26 and 548-550.

Van De Mortel, Dirk "Exploration of Smart Materials for the Use of User-System Interaction", *User System Interaction. Faculty Industrial Design. TU/e*, (Apr. 2002),pp. 21-24.

"PCT Search Report", Application Serial No. PCT/US2009/032288, (Apr. 29, 2009),33 pages.

"PCT Search Report", Application Serial No. PCT/US2009/037191, (May 28, 2009),108 pages.

"Non Final Office Action", U.S. Appl. No. 11/945,879, (Jul. 9, 2009),16 pages.

* cited by examiner

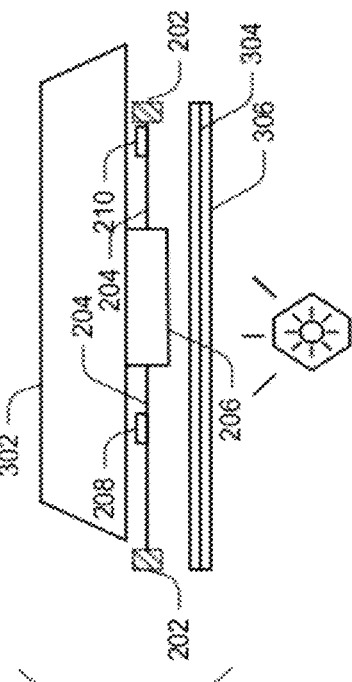
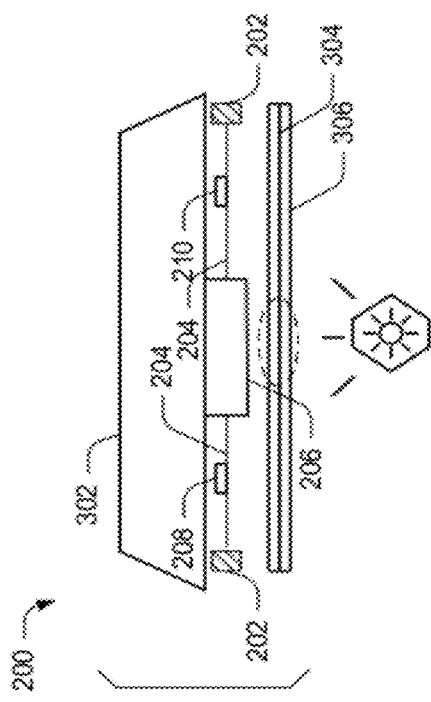
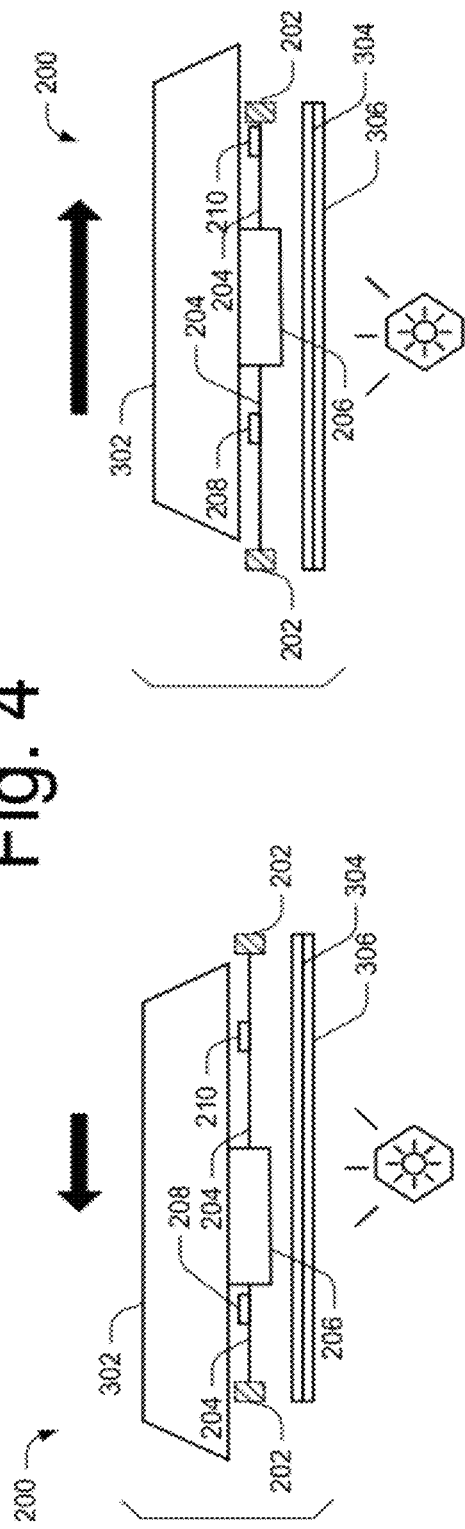

KEYBOARD ADAPTIVE HAPTIC RESPONSE

RELATED APPLICATION

This application claims priority to U.S. Provisional Application No. 61/029,195, filed on Feb. 15, 2008, the disclosure of which is incorporated by reference herein in its entirety.

BACKGROUND

Traditional keyboards and keyboard techniques typically rely on the force input of a user depressing a key or keyboard element in order to deliver a corresponding haptic response confirming the key's actuation (i.e., switch closure). This haptic feedback, commonly referred to as a "snapover" effect, is produced on these traditional keyboards by the user sufficiently depressing the top portion of the key or keyboard element's assembly such that a corresponding rubber dome in the assembly collapses and reforms.

Since the haptic feedback produced on traditional keyboards depends on the position of the top portion, the feedback is inherent in the movement of the key or keyboard element's assembly and correlates with the speed by which the key or keyboard element is depressed. That is to say, the haptic feedback occurs faster when the key or keyboard element is pressed faster, and slower when the key or keyboard element is pressed slower. Missing however, are effective techniques for simulating this type of feedback with non-traditional keyboard techniques which do not employ rubber dome assemblies.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Various embodiments provide a keyboard, such as a physical or virtual keyboard for example, that adaptively provides haptic feedback to a user. In at least some embodiments, an actuation of a key or keyboard element of the keyboard is detected. This can be accomplished by detecting closure of an associated switch caused by a user depressing the key or keyboard element. In response to detecting the actuation, an electrically-deformable material is utilized as an actuating mechanism to impart single or multi-vectored movement to the key or keyboard element according to drive parameters. This movement produces a perceived acceleration of the key or keyboard element, thus providing haptic feedback which simulates a "snapover" effect.

In one or more embodiments, the drive parameters can be selected via a user interface. Alternatively or additionally, the drive parameters can be automatically ascertained from data associated with another actuation(s) of the key or keyboard element. In at least some embodiments, this data can indicate the duration of one or more stages associated with the key or keyboard element being depressed and released.

In one or more embodiments, the single or multi-vectored movement can be dynamically imparted while a user is typing on the key or keyboard element, and/or on another key or keyboard element of the keyboard.

In one or more embodiments, at least one of the drive parameters can designate the duration of a phase(s) of the single or multi-vectored movement. This can include a phase associated with movement of the key or keyboard element in a particular direction and/or with a delay before or after the movement.

BRIEF DESCRIPTION OF THE DRAWINGS

The same numbers are used throughout the drawings to reference like features.

FIG. 4 illustrates a key or keyboard element in accordance with one or more embodiments.

FIG. 5 illustrates a key or keyboard element in accordance with one or more embodiments.

FIG. 6 illustrates a key or keyboard element in accordance with one or more embodiments.

DETAILED DESCRIPTION

Overview

Various embodiments provide a keyboard, such as a physical or virtual keyboard for example, that adaptively provides haptic feedback to a user. Without limitation, the keyboard can include one or more physical keys or touch elements, virtual keys or touch elements, e.g., an icon or other indicia, or any combination thereof. In at least some embodiments, an actuation of a key or keyboard element of the keyboard is detected. This can be accomplished by detecting the closure of an associated switch caused by a user depressing the key or keyboard element. In response to detecting the actuation, an electrically-deformable material is utilized as an actuating mechanism to impart single or multi-vectored movement to the key or keyboard element according to drive parameters. This movement produces a perceived acceleration of the key or keyboard element, thus providing haptic feedback which simulates a "snapover" effect.

In one or more embodiments, the drive parameters can be selected via a user interface. Alternatively or additionally, the drive parameters can be automatically ascertained from data associated with another actuation(s) of the key or keyboard element. In at least some embodiments, this data can indicate the duration, amplitude, or other characteristic of one or more stages associated with the key or keyboard element being depressed and released.

In one or more embodiments, the single or multi-vectored movement can be dynamically imparted while a user is typing on the key or keyboard element, and/or on another key or keyboard element of the keyboard.

In one or more embodiments, at least one of the drive parameters can designate the duration of a phase(s) of the single or multi-vectored movement. This can include a phase associated with movement of the key or keyboard element in a particular direction and/or with a delay before or after the movement.

In the discussion that follows, a section entitled "Example System" is provided and describes a system that can be used in accordance with one or more embodiments. Next, a section entitled "Example Key or Keyboard Element" is provided and describes but one example of a key or keyboard element in accordance with one or more embodiments. Next, a section entitled "Example Sequential Phases" is provided and describes example phases associated with movement of a key or keyboard element in accordance with one or more embodiments. Next, a section entitled "Example Method" is provided and describes a method in accordance with one or more embodiments. Lastly, a section entitled "Example User Interface" is provided and describes but one example of a user interface in accordance with one or more embodiments.

Example System

Figure 1:
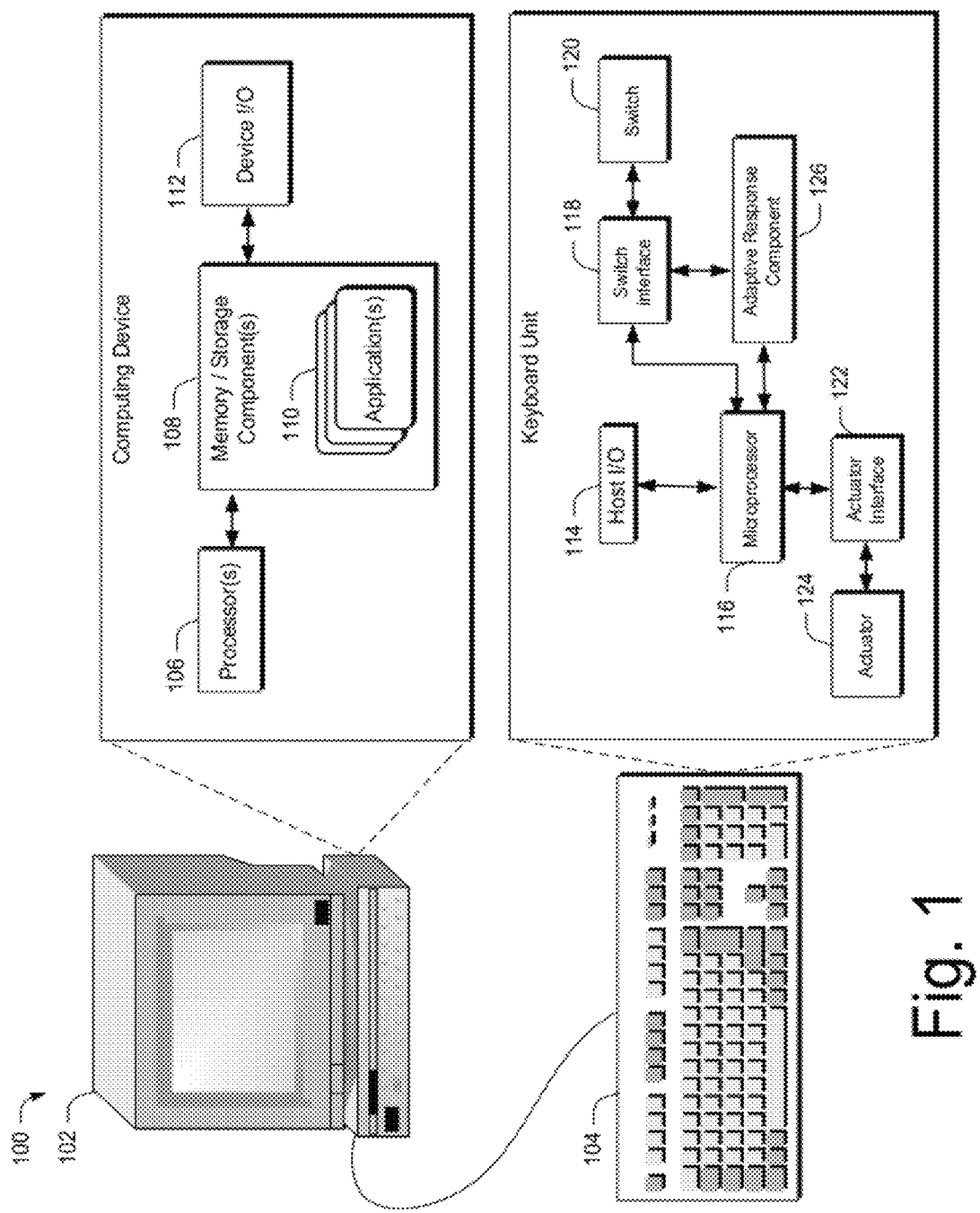
FIG. 1 illustrates an example system in accordance with one or more embodiments.

FIG. 1 illustrates an example system in accordance with one or more embodiments, generally at 100. In this example, system 100 includes a computing device 102 and a keyboard unit 104.

Computing device 102 may be configured as any suitable type of device or devices such as, without limitation, a desktop computer, laptop computer, personal digital assistant (PDA), smart phone, gaming device, or any combination thereof. Computing device 102 includes one or more processors 106, one or more memory and/or storage component(s) 108, and one or more applications 110 that reside on memory and/or storage component(s) 108 and that are executable by processor(s) 106.

Memory and/or storage component(s) 108 represents one or more computer-readable media. Computer-readable media can include, by way of example and not limitation, all forms of volatile and non-volatile memory and/or storage media for storage of information such as computer-readable instructions. Such media can include ROM, RAM, flash memory, hard disk, removable media, and the like.

Application(s) 110, in turn, can include any suitable type of application such as, without limitation, an application associated with storing, presenting, receiving, sending, and/or managing information associated with keyboard unit 104. For example, application(s) 110 can provide a user interface presenting selectable controls for setting, adjusting, or otherwise managing parameters associated with providing haptic feedback via movement of individual key or keyboard elements of keyboard unit 104.

Computing device 102 also includes a device input/output component 112 which enables communication between computing device 102 and various input/output devices, including keyboard unit 104. Any suitable component can be used such as, without limitation, Universal Serial Bus (USB) modules, Bluetooth modules, RS232, PS2, CAN, TCPIP, and the like.

Keyboard unit 104 includes, in this example, a host input/output component 114 which enables communication between keyboard unit 104 and computing device 102. Any suitable component can be used such as, without limitation, USB modules, Bluetooth modules, RS232, PS2, CAN, TCPIP, and the like. Keyboard unit 104 further includes a microprocessor 116, a switch interface 118, a switch 120, an actuator interface 122, an actuator 124, and an adaptive response component 126. These various components can be implemented in connection with any suitable hardware, software, firmware, or combination thereof. In at least some embodiments, components of the keyboard unit can be implemented as an application specific integrated circuit or ASIC.

In operation, switch 120 can be configured to sense when a particular key or keyboard element is actuated. Typically, this involves the key or keyboard element being depressed. However, any suitable sensing technique can be used. For example, a sensor, such as a capacitive sensor, projected field, or the like might be utilized to detect or sense the proximity of an object, e.g., a user's finger, within a certain distance of the key or keyboard element. Switch 120 and/or another component(s) of keyboard unit 104 can also be configured to automatically sense and/or measure one or more characteristics associated with the actuated key or keyboard element. This can include any type of intrinsic and/or derived characteristic that can be sensed such as, without limitation, a duration of one or more stages associated with an actuation, a force(s) applied to the key or keyboard element, a rate(s) of change associated with the actuation, common multi-key usage patterns, or the like. By way of example, switch 120 can be configured to sense the key or keyboard element being depressed and released. In addition, switch 120 can be configured to measure characteristics associated with these events, such as the duration of various stages of the events. More particularly the user might press down on the key or keyboard element with an actuation force sufficient to cause closure of switch 120, and then lift up on and release the key or keyboard element to cause switch 120 to open. Switch 120 can sense the depression event, the release event, and measure the duration of time between them. In addition, switch 120 can also sense a second subsequent depression event and measure the duration of time between the first and second depression event, and/or between the release event and the second depression event.

In at least some embodiments, switch 120 can perform these measurements by utilizing multiple timers configured to be started and stopped in response to switch 120 closing and/or opening. One example of this is presented below in the context of an actuation cycle that includes three stages:

|  | Timer 1 | Timer 2 | Timer 3 |
| --- | --- | --- | --- |
| Switch Closes (first depression event) | Start | Start |  |
| Switch Opens (release event) | Stop |  | Start |
| Switch Closes (second depression event) |  | Stop | Stop |
| Time (milliseconds) | Duration of Stage 1 | Duration of Stage 2 | Duration of Stage 3 |

Continuing, switch interface 118 can be configured to notify microprocessor 116 when the key or keyboard element has been actuated. Microprocessor 116 controls actuator interface 122, which can include drive electronics configured to apply a drive voltage(s) to actuator 124. As described in more below, switch interface 118 can also be configured to provide data to adaptive response component 126 associated one or more of the characteristics sensed and/or measured by switch 120.

In this example, actuator 124 includes an electrically-deformable material, and a physical structure that is mounted to a key or keyboard element in order to facilitate the electrically-deformable material to impart movement to the actuated key or keyboard element. More particularly, when a drive voltage(s) is applied to actuator 124, the actuator is driven in a manner that imparts single or multi-vectored movement to the electrically-deformable material and hence, to the key or keyboard element with which it is associated. In this regard, the actuator is driven in a manner based on the application of the drive voltage(s). As such, movement of the actuated key or keyboard element can be provided in a controlled manner such that it produces a perceived acceleration of the key or keyboard element, thus providing the user with haptic feedback simulating a "snapover" effect.

In this regard, actuator 124 can include any suitable type of electrically-deformable material. For example, one suitable type of electrically-deformable material is an electroactive polymer (EAP). EAP refers to a class of polymers which are formulated to exhibit different physical and/or electrical behaviors and properties. In general, when a voltage(s) is applied to the EAP, the EAP undergoes a deformation in a particular direction. This deformation causes the EAP to move in the particular direction. As such, in the context of actuator 124, movement of the EAP results in single or multi-vectored movement of the actuated key or keyboard element. EAP is available from a company named Artificial Muscle Inc. located in Sunnyvale, Calif.

Another type of suitable electrically-deformable material is an electrostatic material. Components consisting of this type of material can be formed in a shape conducive to providing single or multi-vectored movement when a voltage(s) is applied to them. This is due, at least in part, to the components becoming attracted to one another when the voltage(s) is applied. This, in turn, causes at least one of the components to move in a direction generally toward another of the components.

Naturally, the nature of the haptic feedback provided by movement of individual keys or keyboard elements determines how they "feel" to the user. The user's preferences in this regard may depend on any number of factors. For example, the user may prefer that keys or keyboard elements "feel" a particular way when they are typing at a slow speed, and "feel" another way when they are typing at a faster speed. For example, as explained above, haptic feedback provided by traditional keyboards is typically inherent in the movement of a key or keyboard element assembly, and thus occurs faster when the key or keyboard element is depressed faster, and slower when the key is depressed slower. As such, the user's preferences might be based on this phenomenon. Therefore, to accommodate this and/or to allow for synchrony between the user's typing speed and the corresponding haptic feedback, single or multi-vectored movement of a particular key or keyboard element can be adaptively selected or adjusted. That is to say, the key or keyboard element can be customized, by adjusting the nature of the single or multi-vectored movement, to provide haptic feedback according to the user's preferences and/or to simulate that of traditional keys or keyboard elements.

In operation, this can be accomplished in a variety of ways such as, without limitation, disabling haptic feedback and/or adjusting a movement duration(s), output voltage(s), output force(s), and/or travel distance associated with the key or keyboard element. With respect to adjusting a movement duration(s) in particular, the duration of one or more sequential phases of the single or multi-vectored movement can be adjusted by applying the drive voltage(s) to actuator 124 such that it is driven in a manner that provides the type of movement desired. In at least some embodiments, this can be performed dynamically while the user is typing on the key or keyboard element and/or another key or keyboard element of keyboard unit 104. To facilitate this, adaptive response component 126 can be configured in a variety of ways.

For example, adaptive response component 126 can be configured to facilitate manual adjustment, and thus customization, of the single or multi-vectored movement. More particularly, adaptive response component 126 can receive, via host I/O 114, input from computing device 102. This input can represent data that includes one or more user-selected drive parameters for controlling the drive voltage(s) to be applied to actuator 124. In at least some embodiments, these drive parameters can designate durations, amplitudes, and/or other characteristics of one or more sequential phases associated with movement of the key or keyboard element. Furthermore, these drive parameters can be associated with one or more manually and/or automatically chosen profiles. Adaptive response component 126 can then instruct microprocessor 116 to cause actuator interface 122 to apply, in response to detecting an actuation, a drive voltage(s) to actuator 124. This drive voltage(s) can be sufficient to impart movement to the key or keyboard element according to the selected drive parameter(s). As such, haptic feedback can be adaptively provided in a manner based on the selected drive parameter(s). In at least some embodiments, the user can adjust these drive parameter(s) via a user interface provided by one or more of applications 110.

Alternatively or additionally, adaptive response component 126 can be configured to collect or receive, from switch interface 118, data sensed and/or measured by switch 120. This data can be associated with one or more actuation characteristics of the key or keyboard element, and/or of another key or key board element of keyboard unit 104. For example, the data can indicate or include the duration times, movement amplitudes, and/or other characteristics of various stages associated the key or keyboard element being depressed and released, as described above. Based on the data, adaptive response component 126 can then utilize an algorithm or other suitable technique to calculate or otherwise ascertain, from the data, one or more drive parameters controlling a drive voltage(s) to be applied. Similar to the selected drive parameters, these ascertained drive parameters can designate durations of one or more sequential phases associated with movement of the key or keyboard element. Adaptive response component 126 can then provide the ascertained drive parameter(s) to microprocessor 116. Adaptive response component 126 can also instruct microprocessor 116 to cause actuator interface 122 to apply, in response to an actuation being detected, a drive voltage(s) to actuator 124 sufficient to impart movement to the key or keyboard element according to the ascertained drive parameter(s). As such, haptic feedback can be adaptively provided in a manner based on the ascertained drive parameters.

To assist the reader in understanding and appreciating this discussion, an example algorithm is provided. This example algorithm is suitable for computing drive parameters from data associated with a particular stage of a depression and release event: namely the duration between when an associated switch opens and then closes. It is to be appreciated and understood, however, that this algorithm is but one example, and other suitable algorithms and/or techniques can be used without departing from the spirit and scope of the claimed subject matter.

Example Algorithm:

Drive parameter/Dependent variable: forwardDelayTime (fDT)

Independent variables: keySwitchClosedTime (kSCT), keySwitchOpenTime (kSOT)

Temporary variables: keySwitchClosedTimePrevious (kSCTP), keySwitchOpenTimePrevious (kSOTP), adaptiveCurveSlope (aCS), totalSwitchTimePrevious (tSWP), Performance defining variables/constants: maximumForwardDelay (maxFD), minimumForwardDelay (minFD), maximumMeasurementPeriod (maxMP), minimumMeasurementPeriod (minMP), Initialization
    kSCT=50 (milliseconds)
    kSOT=50 (milliseconds)
    fDT=22;
    maxFD=60 (milliseconds)
    minFD=2 (milliseconds)
    maxMP=1000 (milliseconds)
    minMP=100 (milliseconds)
    start kSOPT timer
1. Event—User closes switch
    a. stop kSOT timer
    b. copy kSCT to kSCTP
    c. reset kSCT timer
    d. start kSCT timer
2. Closed switch is debounced and is now active
    a. continue running kSCT for adaptive calculation that happens next time
    b. aCS=(maxFD−minFD)/(maxMP−minMP)
        i. since the performance variable could change we need to dynamically calculate how quickly the adaptive feedback should change depending on varying user input
    c. tSTP=kSCT+kSOT;
        i. the total amount of time the last keypress was closed and open
    d. fDT=minFD−(aCS*minMP)+tSTP+aCS
        i. using a simple equation based solely on the last key open/close time mapped to the 2 dimensions of performance constants determine what the new delay is
    e. if (fDT>maxFD) then fDT=maxFD
        i. make sure the new delay is not greater than the defined maximum
    f. if (fDT<minFD) then fDT=minFD
        i. make sure the new delay is not less than the defined minimum
    g. activate haptic output according to defined press profile using fDT
3. Event—User opens switch
    a. stop kSCT timer
    b. copy kSOT to kSOTP
    c. reset kSOT timer
    d. start kSOT timer
Open switch is debounced and is now inactive
    continue running kSOT timer
    activate haptic output according to defined release profile using fDT Example Key or Keyboard Element To assist the reader in understanding and appreciating haptic feedback provided by single or multi-vectored key or keyboard element movement, FIGS. 2-6 and the following discussion are provided. For discussion purposes, these figures and the discussion illustrate and describe an example embodiment implemented using an electrically-deformable material that comprises an EAP. However, it is to be appreciated and understood that any other suitable electrically-deformable material, such as electrostatic material for example, can be utilized without departing from the spirit and scope of the claimed subject matter.

Figure 2:
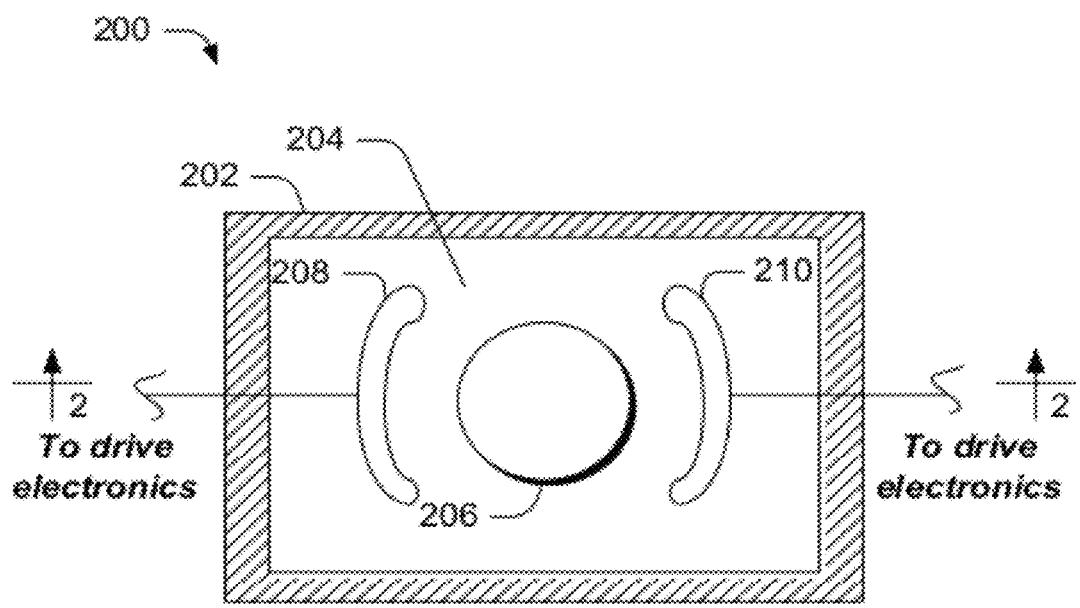
FIG. 2 illustrates a top plane view of an example key or keyboard element in accordance with one or more embodiments.

FIG. 2 illustrates an example key or keyboard element in accordance with one or more embodiments, generally at 200. In this example, key or keyboard element 200 includes a frame 202 which is mounted or otherwise connected to one or more sections of electrically-deformable material 204. Frame 202 is supported by an overall housing which contains or otherwise supports a plurality of keys or keyboard elements. It is to be appreciated and understood that in at least some embodiments, when individual keys or keyboard elements or groupings thereof are moved, the overall housing that supports the keys or keyboard elements is not moved. As such, individual movement of keys or keyboard elements can occur without movement of the corresponding housing.

In this particular embodiment, electrically-deformable material 204 is driven by a drive voltage(s) to effect movement of a particular associated key or keyboard element. To this end, and in this embodiment, key or keyboard element 200 includes a center actuator structure 206 which is mounted to or otherwise joined with electrically-deformable material 204 to effectively form an actuator. Actuator structure 206, in turn, is fixedly connected to an associated key or keyboard element (not shown) which lies above the plane of the page upon which FIG. 2 appears.

Key or keyboard element 200 also includes one or more electrical contacts which are used to apply a drive voltage to electrically-deformable material 204. In the illustrated and described embodiment, first and second electrical contacts 208, 210 are provided and are in electrical communication with electrically-deformable material 204. First and second electrical contacts 208, 210 are connected with drive electronics used to apply a voltage(s) to the contact and hence, cause deformation of electrically-deformable material 204. Any suitable material can be used for contacts 208, 210. In the illustrated and described embodiment, the electrical contacts comprise a carbon material which is mounted to or otherwise joined with the electrically-deformable material.

Figure 3:
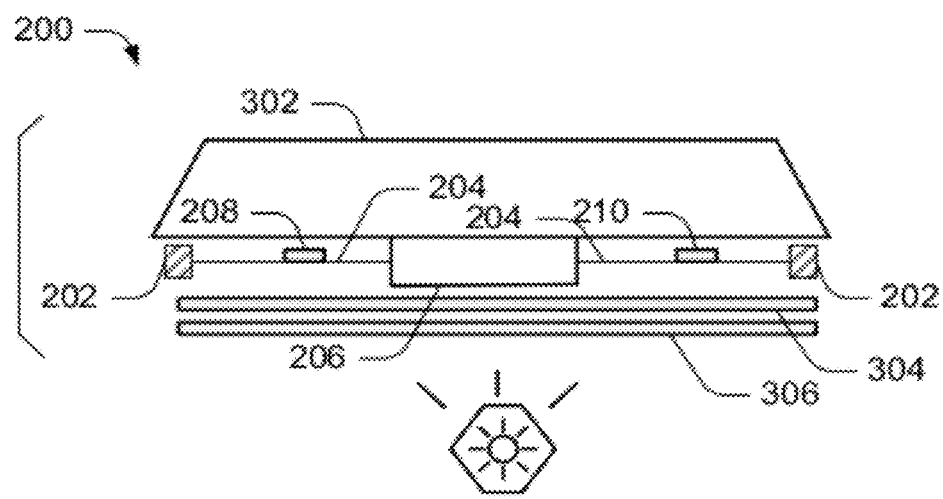
FIG. 3 illustrates the view of the FIG. 1 key or keyboard element, taken along line 2-2 in FIG. 1.

FIG. 3 illustrates key or keyboard element 200 of FIG. 2 in a view that is taken along line 2-2 in FIG. 2. Like numerals from FIG. 2 have been utilized to depict like components in this figure. Here, key or keyboard element 200 includes a user-engageable portion 302 which is the portion that is typically depressed by the user. The user-engageable portion may, for example, correspond to a particular key, such as the letter "A" key, a function key, a shift key, and the like. The user-engageable portion includes a surface—here a top surface—that is typically engaged by the user's finger.

In addition, key or keyboard element 200 includes a pair of switch closure elements 304, 306 forming a switch. The switch closure elements can be formed from any suitable material examples of which include non-tactile membranes that include electrically conductive materials. Other materials include, by way of example and not limitation, conductive elastomeric material, carbon material, piezo-membrane, capacitive sensing, capacitive sensing in combination with piezo sensing, piezo ink, or any combination thereof. In addition, the switch closure elements can be located at any suitable location within the keyboard element. For example, the switch closure elements can be located between portion 302 and an underlying structure, on top of portion 302, or any other suitable location. The switch closure elements are connected to circuitry to detect switch closure.

Referring to FIG. 4, when a user depresses key or keyboard element 200 in the direction shown, switch closure elements 304, 306 are brought into electrical communication (as indicated by the dashed oval) which closes a circuit, thus indicating that the key or keyboard element has been actuated. Circuitry detects the depression event and causes drive electronics to apply one or more drive voltages (e.g., 0-5000 volts) to electrically-deformable material 204. The drive electronics can be configured in any suitable way. For example, in some embodiments, the drive circuitry can include switching circuitry that switches a low voltage side of a power supply on or off using, for example, one power supply per key or keyboard element. Inductive transformers, piezoelectric transformers, charge pumps or any other type of voltage boost circuit can be used to generate sufficient voltage supplies if needed, as will be appreciated by the skilled artisan. Alternately or additionally, various solid state devices can be used to switch power from a single voltage supply to individual actuator (e.g. EAP) portions as required.

When the drive voltage(s) are applied to the electrically-deformable material, single or multi-vectored movement is imparted to actuator structure 206 and hence, to portion 302.

Specifically, and as perhaps best shown in FIGS. 5 and 6, when a user depresses the key or a keyboard element sufficient to effect switch closure, the drive electronics drive the electrically-deformable material, and hence the key or keyboard element, in a first direction which, in this example, is generally toward the user. In this example, the drive voltage(s) is applied through electrical contact 210. Subsequently, the drive electronics, through electrical contact 208, drive the electrically-deformable material in a second, different direction. In this example, the second, different direction is generally away from the user. In at least some embodiments, the first direction moves actuator structure 206 a first distance and a second direction moves actuator structure 206 a second distance which is greater than the first distance. In at least some embodiments, the first distance is about half the distance of the second distance. In at least some embodiments, the first distance is about ½ millimeter and a second distance is about 1 mm.

The electrically-deformable material can be operated in a "single phase" mode or a "dual phase" mode. In a single phase mode, when the material is electrically driven, the material moves the key or keyboard element in a desired direction. When the drive voltage is removed, the material returns to its original, starting position due to the resiliency of the material. In a dual phase mode, the material is driven as described above. Of course, multiple other phases can be used by driving the material to impart to it movements other than the "back and forth" movement described above.

Example Sequential Phases

As explained above, drive parameters can be selected by a user and/or ascertained from data associated with an actuation of a key or keyboard element. Drive parameters can control a drive voltage(s) to be applied to the key or keyboard element. The drive voltage(s) and the control of them, in turn, is responsible for determining the duration, amplitude, or other aspect of one or more sequential phases of the single or multi-vectored movement of the key or keyboard element, and thus the nature of the haptic feedback to be provided. To assist the reader in understanding and appreciating sequential phases, FIG. 7 and the following discussion are provided.

Figure 7:
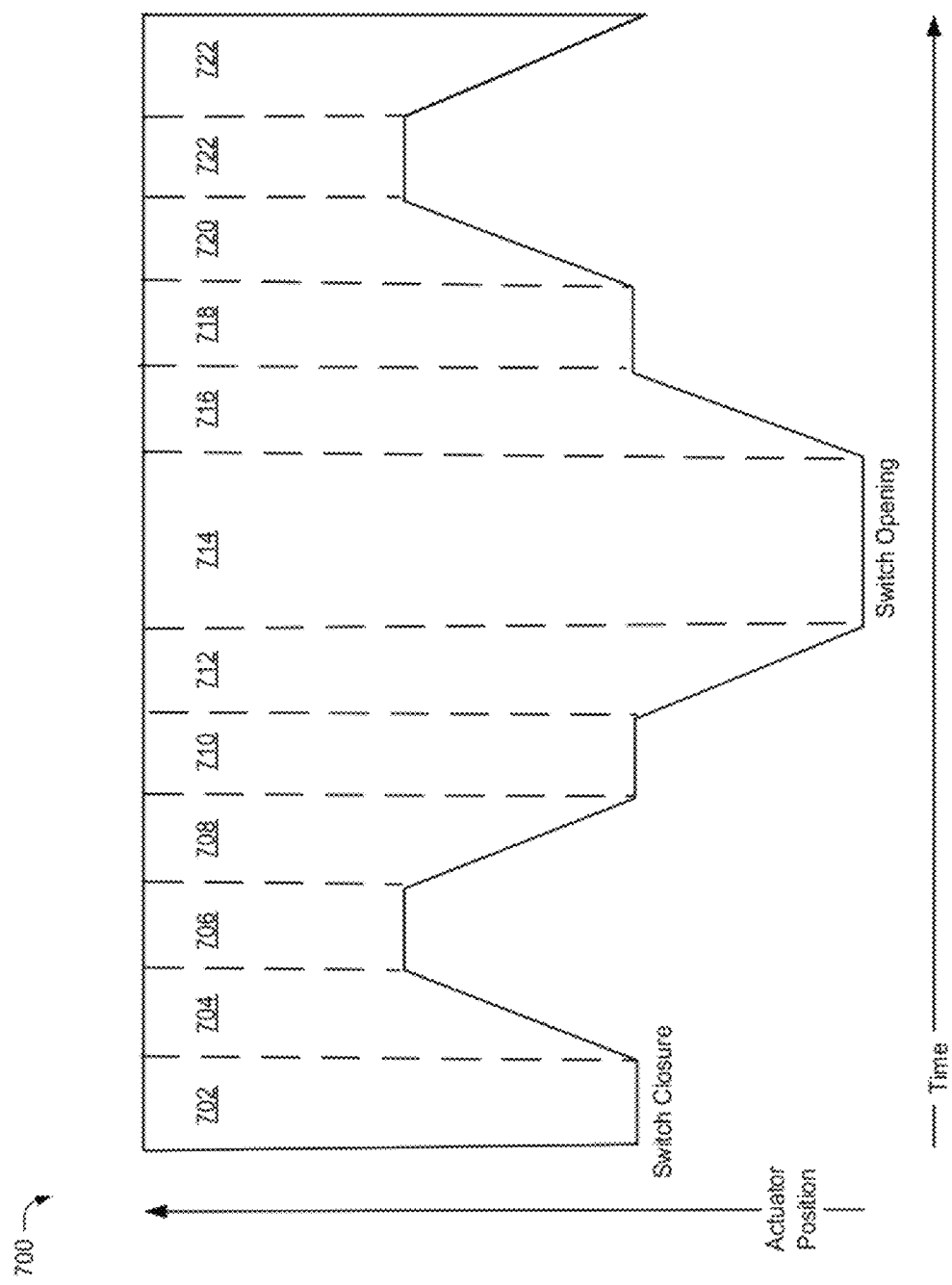
FIG. 7 illustrates example sequential phases associated with movement of a key or keyboard element in accordance with one or more embodiments.

FIG. 7 illustrates example sequential phases, generally at 700, associated with movement of a key or keyboard element, according to one or more embodiments. Here, the horizontal axis represents the time during which depression and release of key or keyboard element occurs. The vertical axis represents the relative position of an actuator of the key or keyboard element. Naturally, the duration of each of these phases defines what a user will feel at their finger. To enhance a user's haptic experience, the duration of one or more these phases can be correlated with the amount of time the user's finger touches, e.g., remains in contact with, the key or keyboard element. This, in turn, significantly impacts the nature of the haptic response provided to the user. In at least some embodiments, the duration of these phases can be adjusted to simulate a haptic response similar to that of a traditional key or keyboard element employing a collapsible rubber dome assembly by way of simulating vertical dome travel as well as adapting feedback speeds to the user's usage speed.

For discussion purposes, example sequential phases 700 are illustrated and described in the context of operating an electrically-deformable material, and thus actuator, in a "dual phase" mode. However, it is to appreciated and understood that the principles and techniques described herein are also applicable to embodiments associated with operating an electrically-deformable material in a "single phase" mode, and/or in multiple other phases as well.

In this example, the sequential phases include a press debounce phase 702. This phase, which is adjustable, is typically not associated with movement of the key or keyboard element. Furthermore, as can be seen, the duration of this phase corresponds with a depression event sufficient to cause closure of a corresponding switch. As such, this phase is a delay with respect to the movement of the key or keyboard element that can be applied in response to, and immediately after, the key or keyboard element being depressed. As a practical example, when a user depresses the key or keyboard element, this phase occurs before drive electronics drive the actuator, and hence the key or keyboard element, in a first direction. In at least some embodiments, the duration of this phase can be adjusted to confirm that a switch close event is intended and to simulate a delay similar to "preloading" of a dome that is inherent with a traditional key or keyboard element, as will be appreciated and understood by the skilled artisan.

Following press debounce phase 702 is an on response time phase 704. This phase, which is adjustable, is associated with movement of the key or keyboard element. More particularly, this phase is defined by the time it takes for the drive electronics to drive, charge, or otherwise activate the actuator in a first direction away from a non-actuated center position to a first actuated position. Note that this time can be separate from the mechanical response time of the actuator which may be faster or slower than this, and may additionally be adjustable in at least some embodiments. This causes movement of the key or keyboard element in the first direction. In at least one embodiment, the first direction is generally toward the user.

Following on response time phase 704 is a forward delay phase 706. This phase, which is adjustable, may or may not be associated with movement of the key or keyboard element. This phase is a delay after the actuator has been electrically enabled to move to the first actuated position. During this delay, the actuator may be moving. For example, if the physical response time of the actuator is slower than that of its electrical response time, the actuator may still be traveling to its target position. Alternatively or additionally, the actuator may have reached it final position but be oscillating due to dampening of the key or keyboard element.

Following forward delay phase 706 is an off response time phase 708. This phase, which is adjustable, is associated with movement of the key or keyboard element. More particularly, this phase is defined by the time it takes for the drive electronics to drive, charge, or otherwise activate the actuator in a second direction, generally opposite the first direction, back to the non-actuated center position. This time can be separate from the mechanical response time of the actuator which may be faster or slower than this, and may additionally be adjustable in at least some embodiments. This causes movement of the key or keyboard element in the second direction. In at least one embodiment, the second direction is generally away from the user.

Following off response time phase 708 is a mid-stroke delay phase 710. This phase, which is adjustable, may or may not be associated with movement of the key or keyboard element. This phase is a delay after the drive electronics have enabled the actuator to move back to the non-actuated center position. During this delay, the actuator may be moving. For example, if the physical response time of the actuator is slower than that of its electrical response time, the actuator may still be traveling to its target position. Alternatively or additionally, the actuator may have reached it final position but be oscillating due to dampening of the key or keyboard element.

Following mid-stroke delay phase 710 is an on response time phase 712. This phase, which is adjustable, is associated with movement of the key or keyboard element. More particularly, this phase is defined by the time it takes for the drive electronics to drive the actuator in the second direction away from the non-actuated center position to a second actuated position. This causes movement of the key or keyboard element in the second direction. Note that this time can be separate from the mechanical response time of the actuator which may be faster or slower than this, and may additionally be adjustable in at least some embodiments.

Following on response time phase 712 is a release debounce phase 714. This phase, which is adjustable, is typically not associated with movement of the key or keyboard element. Instead, this phase is a delay after the actuator has been electrically enabled to move to the second actuated position. Furthermore, as can be seen, the duration of this phase begins with release of the key or keyboard element, causing the switch to open. As such, it can occur in response to, and immediately after, the release. This delay is programmable, and defines both a period of determining that a switch opening event was intentional and a period of delay that, for example, simulates the relaxation of the a traditional key or keyboard element dome's over-travel.

Following release debounce phase 714 is an off response time phase 716. This phase, which is adjustable, is associated with movement of the key or keyboard element. More particularly, this phase is defined by the time it takes for the drive electronics to drive, charge, or otherwise activate the actuator in the first direction away from the second actuated position and back to the non-actuated center position. This time can be separate from the mechanical response time of the actuator which may be faster or slower than this, and may additionally be adjustable in at least some embodiments. This causes movement of the key or keyboard element in the first direction.

Following off response time phase 716 is a mid-stroke delay phase 718. This phase, which is adjustable may or may not be associated with movement of the key or keyboard element. This phase is a delay after the key or keyboard element has moved back to the non-actuated center position. During this delay, the actuator may be moving.

Following mid-stroke delay phase 718 is an on response time phase 720. This phase, which is adjustable, is associated with movement of the key or keyboard element. More particularly, this phase is defined by the time it takes for the drive electronics to drive, charge, or otherwise activate the actuator in the first direction back to or near the first actuated position. This time can be separate from the mechanical response time of the actuator which may be faster or slower than this, and may additionally be adjustable in at least some embodiments. This causes movement of the key or keyboard element in the first direction.

Following response time phase 720 is a forward delay phase 722. This phase, which is adjustable, may or may not be associated with movement of the key or keyboard element. This phase is a delay after the actuator has moved back to or near the first actuated position. During this delay, the actuator may be moving.

Following forward delay phase 722 is an off response time phase 724. This phase, which is adjustable, is associated with movement of the key or keyboard element. More particularly, this phase is defined by the time it takes for the drive electronics to drive, charge, or otherwise activate the actuator in the second direction away from the first actuated position and back to the non-actuated center position. This time can be separate from the mechanical response time of the actuator which may be faster or slower than this, and may additionally be adjustable in at least some embodiments. This causes movement of the key or keyboard element in the second direction.

Example Method

Figure 8:
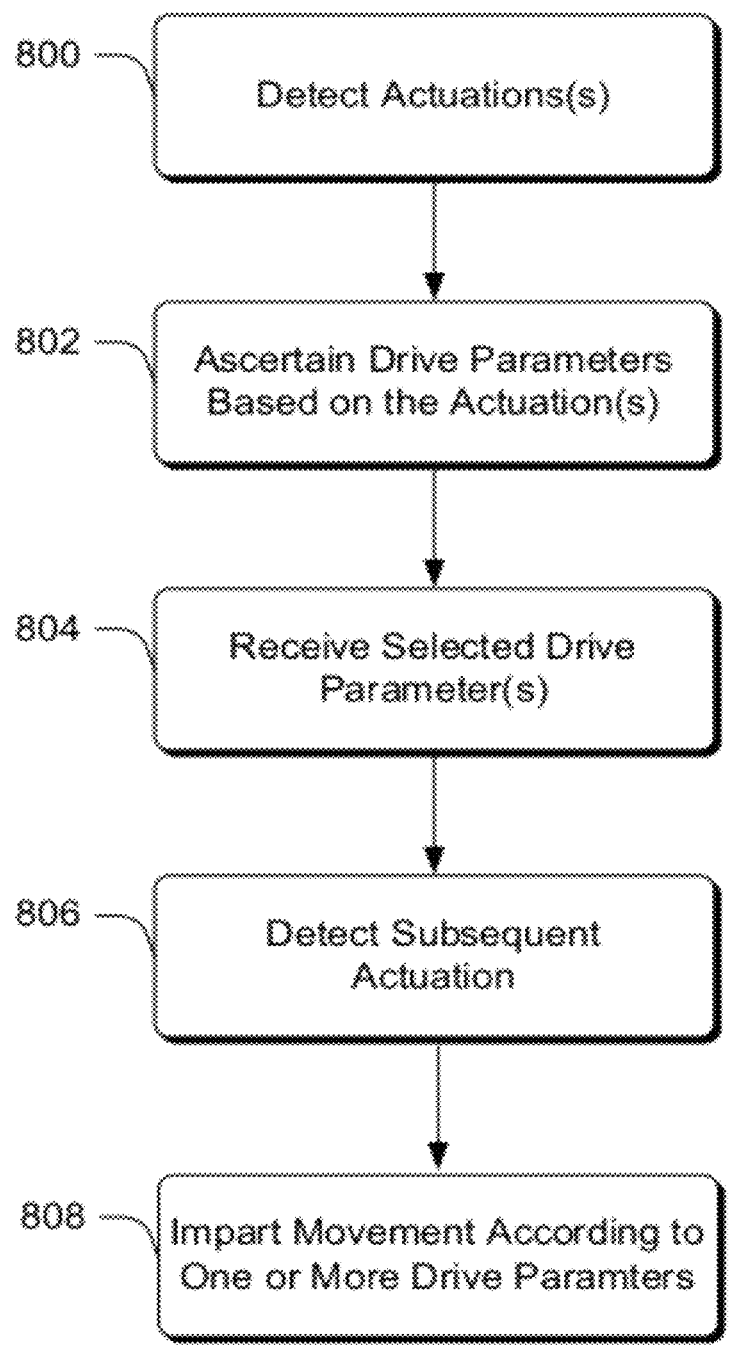
FIG. 8 is a flow diagram that describes steps in a method in accordance with one or more embodiments.

FIG. 8 is a flow diagram that describes steps of a method in accordance with one or more embodiments. The method can be implemented in connection with any suitable hardware, software, firmware, or combination thereof. Furthermore, one or more of the steps of the method can be repeated any number of times. In at least some embodiments, the method can be implemented by a system, such as the example system illustrated and described above. However, it is to be appreciated and understood that the described method can be implemented by systems other than that described above without departing from the spirit and scope of the claimed subject matter.

Step 800 detects one or more key or keyboard element actuations. As illustrated and described above, in at least some embodiments an actuation can be detected by sensing that an individual key or keyboard element has been depressed. Of course, other ways of sensing a switch closure can be used without departing from the spirit and scope of the claimed subject matter.

Responsive to detecting one or more actuations at step 800, step 802 ascertains one or more drive parameters based on the actuation(s) detected at step 800. As illustrated and described above, in at least some embodiments depression and release events for individual actuations are sensed and characteristics associated with these events are measured, such as the duration of one or more stages defined by these actuation events for example. As explained above, data associated with the measured characteristics can then be collected and used to ascertain the drive parameter(s).

Step 804 receives one or more selected drive parameters. As illustrated and described above, in at least some embodiments the user has selected the drive parameter(s) by interacting with user interface controls and/or a so called "wizard" to customize the "feel" of individual keys or keyboard elements of the keyboard. Data designating the selected drive parameter(s) can then be sent to, and received by, the keyboard.

Step 806 detects a subsequent actuation of a particular key or keyboard element. That is to say, this step detects another actuation of the key or keyboard element that occurs after the one or more actuations detected at step 800 occur. Similar to step 800, and as illustrated and described above, one way this can be accomplished is by sensing when an associated key or keyboard element has been depressed.

Responsive to detecting the subsequent actuation at step 806, step 808 imparts movement according to one or more of the drive parameters. These drive parameters can include one or more of the selected drive parameter(s) and/or one or more of the ascertained drive parameters. As illustrated and described above, in at least some embodiments this can be accomplished by applying a drive voltage(s) to an associated actuator sufficient to impart movement to the key or keyboard element according to the selected drive parameter(s).

Example User Interface

Having considered the discussion above, consider now an example user interface presenting controls for adjusting duration settings of one or more sequential phases associated with movement of individual keys or keyboard elements of a keyboard. As explained above, the duration settings can be included in drive parameters for controlling a drive voltage(s) to be applied to a particular key or keyboard element. This, in turn, can determine the nature of the haptic feedback to be provided by key or keyboard element.

Figure 9:
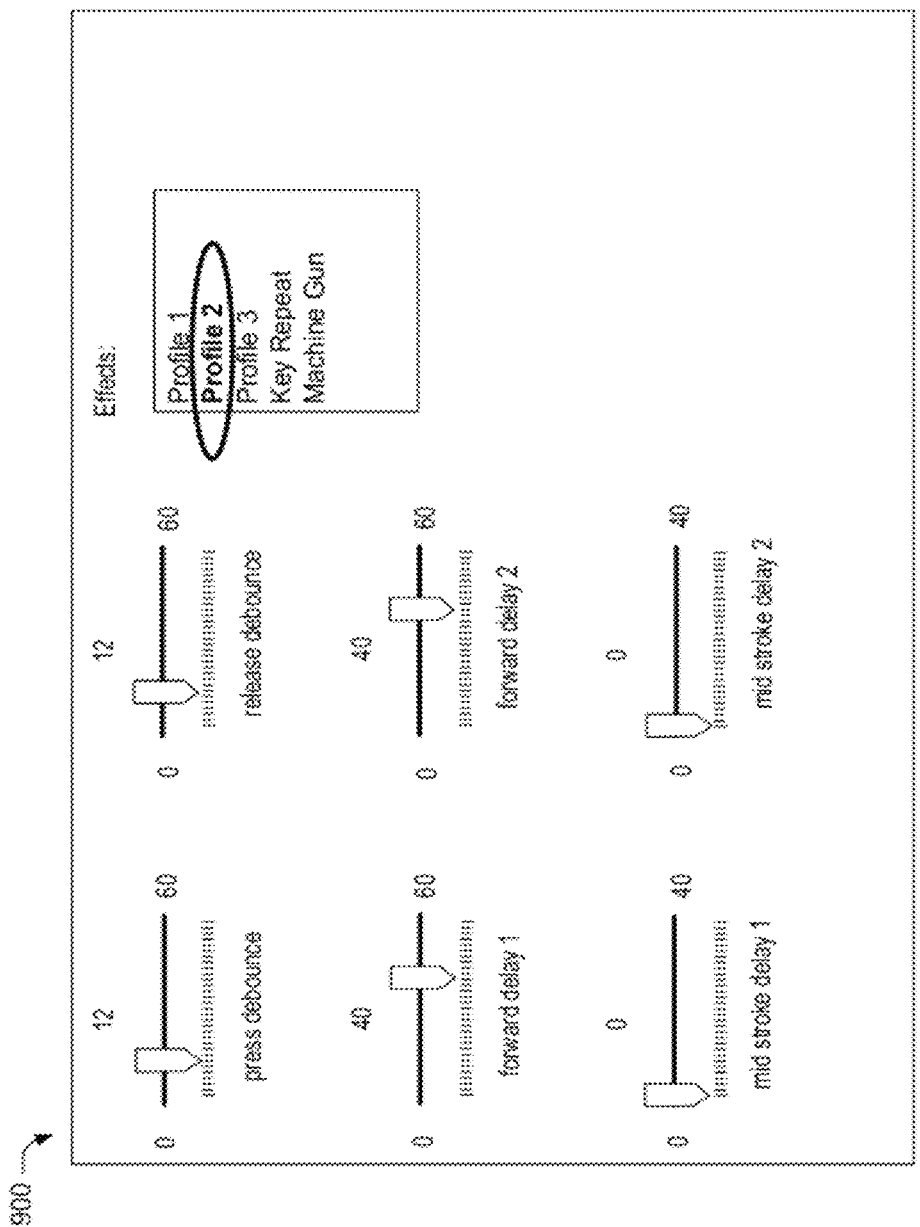
FIG. 9 illustrates an example user interface in accordance with one or more embodiments.

FIG. 9 illustrates an example user interface, generally at 900, in accordance with one or more embodiments. Here, user interface 900 includes several adjustable controls, each control corresponding to a duration setting for a sequential phase. In this example, the controls include a slide-bar for adjusting the settings. Furthermore, the available range of settings for each control is defined on the lower end by 0 milliseconds, and on the higher end by either 40 or 60 milliseconds. However, it is to be appreciated and understood that any suitable range of settings and setting units, e.g., sub-milliseconds, can be used without departing from the spirit and scope of the claimed subject matter. In addition, here the current setting for each control is shown just above the corresponding slide-bar. Note that in this example, the current settings are associated with a corresponding profile, here shown as "Profile 2" which is bolded and circled. Profile 2 is one of many sets, or profiles, of duration settings that can be selected and/or adjusted. In this example, other available profiles are also available for selection, as depicted in the selectable control window labeled "Effects". More particularly, the other available profiles include those named "Profile 1", "Profile 3", "Key Repeat", and "Machine Gun". In this regard, it is to be appreciated and understood that different individual profiles can have any number of the same and/or different duration settings.

Naturally, by virtue of being associated with a particular combination of duration settings, each of these available profiles is associated with providing a particular corresponding haptic feedback. As such, certain profiles might be preferable to a particular user in a particular situation. For example, the speed by which the user is or will be typing might determine which profile is preferred. Alternatively or additionally, the type of application that the user is or will be engaged with might determine which profile is preferred. Naturally, certain profiles might thus be used as default profiles for a particular situation(s). For example, a default profile might be used for a user when they begin to type on a keyboard. As such, haptic feedback can be provided to the user based on duration settings of the default profile. However, based at least in part on characteristics of their typing, e.g., the speed, duration and/or frequency of depression and/or release events associated with individual keys or keyboard elements, another profile might automatically and/or manually replace the default profile, thus changing the haptic feedback provided based on duration settings of the new profile. To facilitate the user in adjusting the duration settings and/or defining profiles with duration settings, any suitable application(s) can be employed. By way of example and not limitation, this might include an application providing a so called "wizard" that accounts for the user's typing style at different typing speeds and assists the user to create default profiles with appropriate duration settings and/or other types of drive parameters. In at least some embodiments, controls for interacting with the so called "wizard" can be included on a user interface, such as on user interface 900 for example.

Conclusion

Various embodiments provide a keyboard, such as a physical or virtual keyboard for example, that adaptively provides haptic feedback to a user. In at least some embodiments, an actuation of a key or keyboard element of the keyboard is detected. This can be accomplished by detecting the closure of an associated switch caused by a user depressing the key or keyboard element. In response to detecting the actuation, an electrically-deformable material is utilized as an actuating mechanism to impart single or multi-vectored movement to the key or keyboard element according to drive parameters. This movement produces a perceived acceleration of the key or keyboard element, thus providing haptic feedback which simulates a "snapover" effect.

In one or more embodiments, the drive parameters can be selected via a user interface. Alternatively or additionally, the drive parameters can be automatically ascertained from data associated with another actuation(s) of the key or keyboard element. In at least some embodiments, this data can indicate the duration, amplitude, and/or other characteristic of one or more stages associated with the key or keyboard element being depressed and released.

In one or more embodiments, the single or multi-vectored movement can be dynamically imparted while a user is typing on the key or keyboard element, and/or on another key or keyboard element of the keyboard.

In one or more embodiments, at least one of the drive parameters can designate the duration, amplitude, or other aspect of a phase(s) of the single or multi-vectored movement. This can include a phase associated with movement of the key or keyboard element in a particular direction and/or with a delay before or after the movement.

What is claimed is:

1. A method comprising:
   detecting an actuation of a key or keyboard element of a keyboard, wherein the key or keyboard element actuation is associated with the key or keyboard element; and
   responsive to detecting the actuation, dynamically imparting single or multi-vectored movement to the key or keyboard element according to one or both of:
   at least one user-selected parameter; or
   at least one ascertained parameter based on one or more other key or keyboard element actuations, wherein the at least one ascertained parameter is automatically ascertained from data associated with the one or more other key or keyboard element actuations and further wherein one or both of the at least one user-selected parameter or the at least one ascertained parameter designate a duration of one or more phases of the single or multi-vectored movement.

2. The method of claim 1, wherein the at least one user-selected parameter is selected by a user via a user interface.

3. The method of claim 1, wherein the one or more phases includes an adjustable press debounce phase corresponding to a depression event sufficient to cause closure of a corresponding switch.

4. The method of claim 1, wherein the one or more phases includes an adjustable on response time phase corresponding to a time to activate an actuator in a first direction.

5. The method of claim 1, wherein the one or more phases includes an adjustable forward delay phase corresponding to a delay after the actuator has been electrically enabled to move to a first actuated position.

6. The method of claim 1, wherein the one or more phases includes an adjustable off response time phase corresponding to a time to activate the actuator in a second direction, back to a non-actuated center position.

7. The method of claim 1, wherein the one or more phases includes an adjustable mid-stroke delay phase corresponding to a delay after the actuator has moved back to the non-actuated center position.

8. The method of claim 1, wherein the one or more phases includes a second adjustable on response time phase corresponding to a time to activate the actuator in a second direction away from the non-actuated center position to a second actuated position.

9. The method of claim 1, wherein the one or more phases includes an adjustable release debounce phase corresponding to a delay after the actuator has been electrically enabled to move to the second actuated position.

10. The method of claim 1, wherein the one or more phases includes an adjustable off response time phase corresponding to a time it takes to activate the actuator in the first direction away from the second actuated position and back to the non-actuated center position.

11. The method of claim 1, wherein the one or more phases includes a third adjustable on response time phase corresponding to a time to activate the actuator in the first direction back to or near the first actuated position.

12. The method of claim 1, wherein the one or more phases includes a second adjustable off response time phase corresponding to a time it takes to activate the actuator in the second direction away from the first actuated position and back to the non-actuated center position.

13. A keyboard comprising:
a plurality of keys or keyboard elements;
a switch associated with a key or keyboard element, wherein the switch is configured to detect actuations of the key or keyboard element:
an actuator operably associated with the switch and the key or keyboard element, wherein the actuator is configured to impart, in response to detecting an actuation of the key or keyboard element, single or multi-vectored movement to the key or keyboard element according to at least one ascertained parameter based on one or more other key or keyboard element actuations and further wherein the at least one ascertained parameter designates a duration of one or more phases of the single or multi-vectored movement.

14. The keyboard of claim 13, wherein the actuator comprises an electrically-deformable material connected to the key or keyboard element.

15. The keyboard of claim 13, wherein the duration of one or more phases of the single or multi-vectored movement includes an on response time phase.

16. The keyboard of claim 13, wherein the duration of one or more phases of the single or multi-vectored movement includes an off response time phase.

17. The keyboard of claim 13, wherein the one or more other key or keyboard element actuations comprise one or more key or keyboard element depression and release events.

18. The keyboard of claim 17, wherein the switch is further configured to measure durations of one or more stages associated with individual key or keyboard element depression and release events.

19. The keyboard of claim 18, further comprising an adaptive response component configured to automatically ascertain the at least one ascertained parameter from data indicating the durations.

20. The keyboard of claim 13, wherein the one or more other key or keyboard element actuations are associated with the key or keyboard element.

21. A system comprising:
a keyboard comprising a plurality of keys or keyboard elements;
an actuator operably associated with a key or keyboard element of the keyboard, wherein the actuator is configured to impart, in response to an actuation of the key or keyboard element, single or multi-vectored movement to the key or keyboard element according to one or more parameters, wherein one of the one or more parameters designates a duration of one or more phases of the single or multi-vectored movement;
an adaptive response component configured to automatically ascertain at least one of the one or more parameters from data associated with one or more other key or keyboard element actuations.

22. The system of claim 21, wherein the actuator comprises an electrically-deformable material connected to the key or keyboard element.

23. The system of claim 22, wherein the electrically-deformable material comprises an electrostatic material.

24. The system of claim 21, wherein the duration of one or more phases of the single or multi-vectored movement is an on response time phase associated with a movement of the key or keyboard element.

25. The system of claim 21, wherein the one or more other key or keyboard element actuations are associated with the key or keyboard element.

* * * * *